United States Patent
Bani Milhim et al.

(10) Patent No.: US 12,275,360 B2
(45) Date of Patent: Apr. 15, 2025

(54) SYSTEMS AND METHODS FOR MONITORING GROUND LINE DEGRADATION OF ELECTRIC DEVICES COUPLED TO A COMMUNICATION BUS

(71) Applicant: GM GLOBAL TECHNOLOGY OPERATIONS LLC, Detroit, MI (US)

(72) Inventors: Alaeddin Bani Milhim, Pickering (CA); Hossein Sadjadi, Thornhill (CA); Hadyan Sani Ramadhan, North York (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 289 days.

(21) Appl. No.: 17/809,240

(22) Filed: Jun. 27, 2022

(65) Prior Publication Data

US 2023/0415676 A1    Dec. 28, 2023

(51) Int. Cl.
| | | |
|---|---|---|
| B60R 16/023 | (2006.01) |
| G01R 19/00 | (2006.01) |
| G01R 31/00 | (2006.01) |
| G01R 31/08 | (2020.01) |
| G07C 5/08 | (2006.01) |

(52) U.S. Cl.
CPC ...... B60R 16/0232 (2013.01); G01R 19/0084 (2013.01); G01R 31/006 (2013.01); G01R 31/081 (2013.01); G07C 5/0808 (2013.01); G07C 5/0816 (2013.01)

(58) Field of Classification Search
CPC ............ B60R 16/0232; G01R 19/0084; G01R 31/006; G01R 31/081; G01R 31/007; G01R 31/52; G07C 5/0808; G07C 5/0816
See application file for complete search history.

(56) References Cited

U.S. PATENT DOCUMENTS

| | | | |
|---|---|---|---|
| 2014/0103937 A1* | 4/2014 | Khan | G01R 31/40 324/762.08 |
| 2019/0378349 A1* | 12/2019 | Liu | G07C 5/006 |
| 2021/0041505 A1* | 2/2021 | Fan | G01R 31/3648 |
| 2024/0013648 A1* | 1/2024 | Nakanishi | H04B 3/46 |

FOREIGN PATENT DOCUMENTS

CN     112684371 A  *  4/2021

OTHER PUBLICATIONS

CN-112684371—A Machine Translation (year: 2021).*

* cited by examiner

*Primary Examiner* — Jean Paul Cass
*Assistant Examiner* — Lidia Kwiatkowska
(74) *Attorney, Agent, or Firm* — Lorenz & Kopf LLP

(57) ABSTRACT

Methods and systems are provided for monitoring ground line degradation of electric devices coupled to a communication bus. The method includes, by a processor: receiving voltage data including measurements of voltages of messages transmitted by the electric device over the communication bus, generating health indicators from the voltage data associated with ground line degradation of the electric device, the health indicators including statistical moments calculated based on the voltage data, and determining a health stage of the electric device based on the health indicators, the health stage including a classification based on a relationship between ground line degradation and communication loss for the electric device.

20 Claims, 3 Drawing Sheets

SYSTEMS AND METHODS FOR MONITORING GROUND LINE DEGRADATION OF ELECTRIC DEVICES COUPLED TO A COMMUNICATION BUS

INTRODUCTION

The technical field generally relates to a communication of electric devices coupled to a communication bus, and more particularly relates to systems and methods for monitoring ground line degradation of electric devices interconnected to a communication bus to estimate a health stage of at least one of the electric devices.

Vehicles may include a plurality of electronic control unit (ECU) nodes that utilize a distributed controller area network (CAN) system that enables the ECU nodes to communicate with each other without a host computer. Exemplary ECU nodes may include, but are not limited to, an engine control module (ECM), a powertrain control module (PCM), a transmission control module (TCM), a brake control module (EBCM), a central control module (CCM), a central timing module (CTM), a general electronic module (GEM), a body control module (BCM), and a suspension control module (SCM).

Loss of communication between ECU nodes on a CAN may impact critical functionalities of a vehicle or another system that relies on the CAN. A possible cause of communication loss is ECU ground fault, that is, corrosion of a ground line of an ECU node. Ground line corrosion may develop over time and can be difficult to detect prior to functionality loss.

Accordingly, it is desirable to have systems and methods configured to detect ground line degradation of ECUs in a CAN prior to communication loss. In addition, it is desirable to have systems and methods configured to estimate a remaining useful life of one or more ECUs of a CAN. Furthermore, other desirable features and characteristics of the present invention will become apparent from the subsequent detailed description and the appended claims, taken in conjunction with the accompanying drawings and the foregoing technical field and background.

SUMMARY

A method is provided for monitoring ground line degradation of an electric device coupled to a communication bus. The method includes, by a processor: receiving voltage data including measurements of voltages of messages transmitted by the electric device over the communication bus, generating one or more health indicators from the voltage data associated with ground line degradation of the electric device, the one or more health indicators including one or more statistical moments calculated based on the voltage data, and determining a health stage of the electric device based on the one or more health indicators, the health stage including a classification based on a relationship between ground line degradation and communication loss for the electric device.

In an embodiment, the method includes, by the processor, generating a remaining useful life (RUL) estimate of the electric device based on the health stage, the RUL estimate including a period of time remaining until the ground line degradation results in communication loss of greater than a communication loss threshold.

In an embodiment, the communication bus is a component of a controller area network (CAN), and the electric device is one of a plurality of electronic control unit (ECU) nodes coupled to the communication bus.

In an embodiment, the method includes measuring the voltages with the processor or a second processor executing a central gateway module (CGM).

In an embodiment, the method includes, by the processor: receiving the voltage data over a period of time to obtain measurements of voltages associated with a plurality of messages, buffering the voltage data in a recessive state to define buffered voltage data, and computing a common mode statistical distribution from the buffered data.

In an embodiment, the method includes removing, by the processor, outliers from the common mode statistical distribution.

In an embodiment, the method includes fusing, by the processor, the health indicators prior to estimating the health stages therewith.

In an embodiment, the method includes generating or initiating, by the processor, a notification if the health stage is less than a minimum health stage threshold.

In an embodiment, the method includes buffering, by the processor, the health stage to select a first RUL model from a plurality of RUL models prior to generating the RUL estimate of the electric device with the first RUL model.

In an embodiment, the method includes storing, in a remote database, historical data associated with the RUL estimate of the electric device, and revising, by the processor, one or more of the plurality of RUL models based on the historical data.

A system is provided for monitoring ground line degradation of an electric device coupled to a communication bus. The system includes a computer system configured to, by a processor: receive voltage data including measurements of voltages of messages transmitted by the electric device over the communication bus, generate one or more health indicators from the voltage data associated with ground line degradation of the electric device, the one or more health indicators including one or more statistical moments calculated based on the voltage data, and determining a health stage of the electric device based on the one or more health indicators, the health stage including a classification based on a relationship between ground line degradation and communication loss for the electric device.

In an embodiment, the computer system is configured to, by the processor, generate a remaining useful life (RUL) estimate of the electric device based on the health stage, the RUL estimate including a period of time remaining until the ground line degradation results in communication loss of greater than a communication loss threshold.

In an embodiment, the communication bus is a component of a controller area network (CAN), and the electric device is one of a plurality of electronic control unit (ECU) nodes coupled to the communication bus.

In an embodiment, the computer system is configured to, by the processor, measure the voltages.

In an embodiment, the computer system is configured to, by the processor: receive the voltage data over a period of time to obtain measurements of voltages associated with a plurality of messages, buffer the voltage data in a recessive state to define buffered voltage data, and compute a common mode statistical distribution from the buffered data.

In an embodiment, the computer system is configured to, by the processor, remove outliers from the common mode statistical distribution.

In an embodiment, the computer system is configured to, by the processor, fuse the health indicators prior to estimating the health stages therewith.

In an embodiment, the computer system is configured to, by the processor, generate or initiate a notification if the health stage is less than a minimum health stage threshold.

In an embodiment, the computer system is configured to, by the processor, buffer the health stage to select a first RUL model from a plurality of RUL models prior to generating the RUL estimate of the electric device with the first RUL model.

In an embodiment, the computer system is configured to, by the processor: store, in a remote database, historical data associated with the RUL estimate of the electric device, and revise one or more of the plurality of RUL models based on the historical data.

A vehicle is provided. The vehicle includes a communication bus, an electric device coupled to the communication bus, a computer system onboard the vehicle and configured to, by a processor: receive voltage data including measurements of voltages of messages transmitted by the electric device over the communication bus, generate one or more health indicators from the voltage data associated with ground line degradation of the electric device, the one or more health indicators including one or more statistical moments calculated based on the voltage data, and determine a health stage of the electric device based on the one or more health indicators, the health stage including a classification based on a relationship between ground line degradation and communication loss for the electric device.

In an embodiment, the computer system is configured to, by the processor, generate a remaining useful life (RUL) estimate of the electric device based on the health stage, the RUL estimate including a period of time remaining until the ground line degradation results in communication loss of greater than a communication loss threshold.

In an embodiment, the communication bus is a component of a controller area network (CAN), and the electric device is one of a plurality of electronic control unit (ECU) nodes coupled to the communication bus onboard the vehicle.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
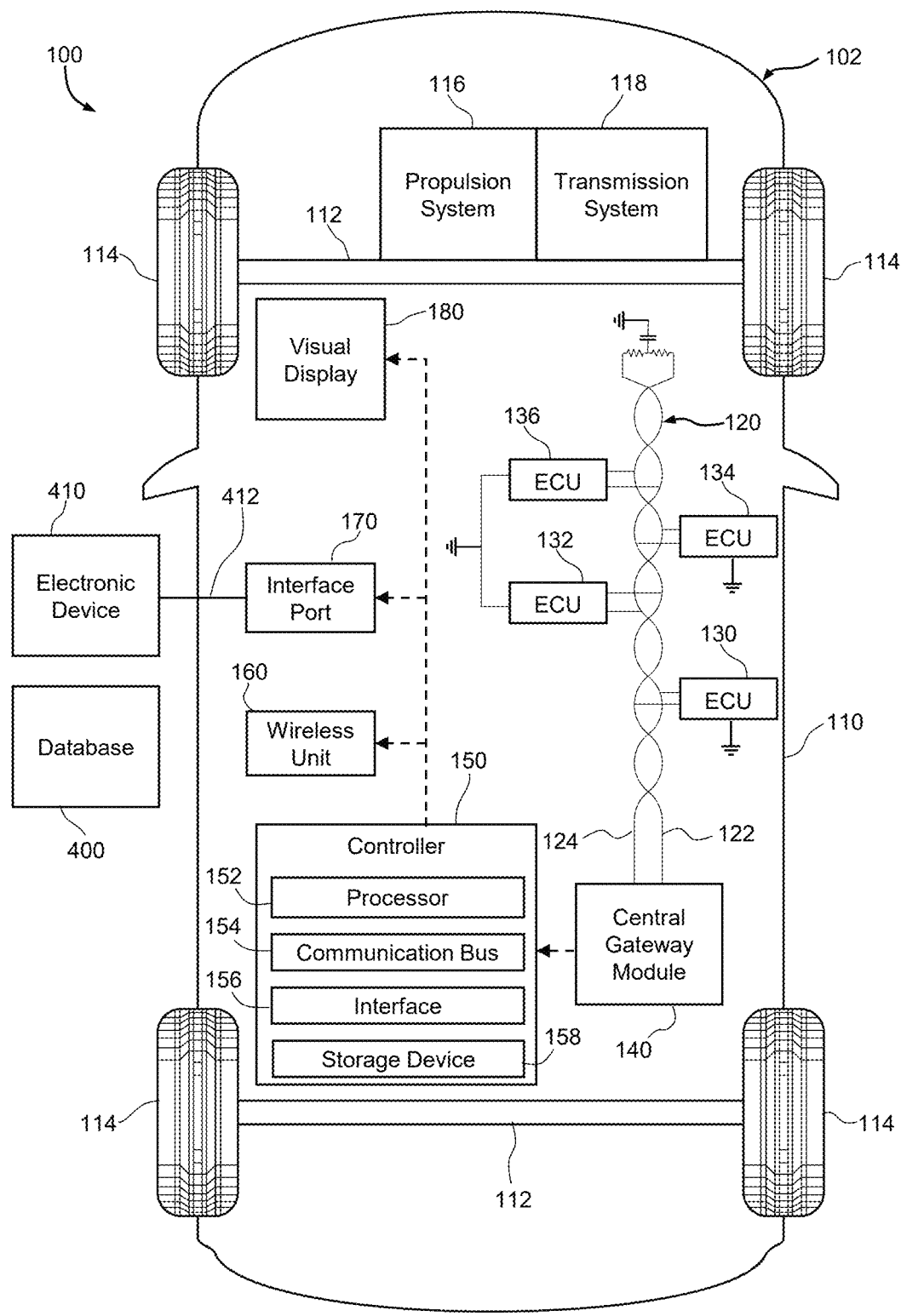
FIG. 1 is a functional block diagram of a vehicle that includes a communication bus coupling electric devices and a bus monitoring system for monitoring ground line degradation of the electric devices in accordance with an embodiment.

The following detailed description is merely exemplary in nature and is not intended to limit the application and uses. Furthermore, there is no intention to be bound by any expressed or implied theory presented in the preceding technical field, background, brief summary or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein is merely exemplary embodiments of the present disclosure.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

While the systems and methods are described in reference to vehicle communications, and in particular a controller area network (CAN) interconnecting electronic control unit (ECU) nodes, it should be understood that automotive applications are merely exemplary, and that the systems and methods may be applicable to other communication systems such as, for example, general industrial automation applications, general manufacturing applications, and other communication systems utilizing a non-isolated multi-drop bus.

The term "vehicle" as described herein includes but is not limited to passenger automobiles, motorcycles, trucks, sports utility vehicles (SUVs), recreational vehicles (RVs), marine vessels, aircraft, farming vehicles, and construction vehicles.

Referring now to FIG. 1, a monitoring system shown generally at 100 is associated with a vehicle 102 in accordance with various embodiments. The vehicle 102 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD), and/or various other types of vehicles in certain embodiments. In various embodiments, the vehicle 102 may also comprise other types of mobile platforms and is not limited to an automobile.

As depicted in FIG. 1, the exemplary vehicle 102 generally includes a chassis 112, a body 110, and front and rear wheels 114. The body 110 is arranged on the chassis 112 and substantially encloses components of the vehicle 102. The body 110 and the chassis 112 may jointly form a frame. The wheels 114 are each rotationally coupled to the chassis 112 near a respective corner of the body 110.

The vehicle 102 further includes a propulsion system 116, a transmission system 118, a communication bus 120, electric devices 130-136, a voltage measuring electronic device and/or module 140 configured to measure voltages on the communication bus 120, and at least one controller 150. The propulsion system 116 may, in various embodiments, include an internal combustion engine, an electric machine such as a traction motor, and/or a fuel cell propulsion system. The transmission system 118 is configured to transmit power from the propulsion system 116 to the wheels 114 according to selectable speed ratios. According to various embodiments, the transmission system 118 may include a step-ratio automatic transmission, a continuously-variable transmission, or other appropriate transmission.

In various embodiments, the communication bus 120 may be a portion of a controller area network (CAN) interconnecting electronic control unit (ECU) nodes (e.g., the electric devices 130-136; hereinafter referred to as the ECU nodes 130-136). The CAN implements a multi-master broadcast serial bus standard with a two-wire balanced signaling scheme defined by ISO-11898-2. Each of the ECU nodes 130-136 is connected to two bus wires of the communication bus 120, that is, a CAN High wire 122 and a CAN Low wire 124. In some examples, a common mode voltage ranges from 1.5 volts on the CAN Low wire 124 to 3.5 volts on the CAN High wire 122. More specifically, the two-wire CAN generally has a differential voltage above 1 volt.

The CAN protocol includes a recessive state and a dominant state (i.e., bits) represented with a differential voltage. In the recessive state (logical 1), the differential voltage on the CAN High wire 122 and the CAN Low wire 124 is less than a minimum threshold. In the dominant state (logical 0), the differential voltage on the CAN High wire 122 and the CAN Low wire 124 is greater than a minimum threshold. Each of the ECU nodes 130-136 on the communication bus 120 is able to send and receive messages, referred to as frames, that include data and identification information.

The ECU nodes 130-136 are configured to execute various modules to control various systems and components of the vehicle 102 such as, but not limited to, controlling various sensors and actuators of the vehicle 102. Exemplary modules that may be executed on the ECU nodes 130-136 include, but are not limited to, an engine control module (ECM), a powertrain control module (PCM), a transmission control module (TCM), a brake control module (EBCM), a central control module (CCM), a central timing module (CTM), a general electronic module (GEM), a body control module (BCM), and a suspension control module (SCM).

The voltage measuring electronic device and/or module 140 is configured to measure voltage on the communication bus 120 associated with messages transmitted thereon by the ECU nodes 130-136. For convenience, the voltage measuring electronic device and/or module 140 will be described in reference to a central gateway module (CGM) (referred to hereinafter as the CGM 140). The CGM 140 may be operating on a specific electric device having suitable hardware for measuring the voltages on the communication bus 120. In some embodiments, the CGM 140 may be installed and running on an ECU node. In addition to measuring the voltages, the CGM 140 may be configured to communicate with a plurality of different networks onboard the vehicle 102 and allow for communication between multi-protocol and connected services. In various embodiments, the CGM 140 may be installed and executed on the controller 150.

The controller 150 includes at least one processor 152, a communication bus 154, an interface 156, and a computer readable storage device or media 158. The processor 152 can be any custom made or commercially available processor, a central processing unit (CPU), a graphics processing unit (GPU), an auxiliary processor among several processors associated with the controller 150, a semiconductor-based microprocessor (in the form of a microchip or chip set), a macroprocessor, any combination thereof, or generally any device for executing instructions. The computer readable storage device or media 158 may include volatile and nonvolatile storage in read-only memory (ROM), random-access memory (RAM), and keep-alive memory (KAM), for example. KAM is a persistent or nonvolatile memory that may be used to store various operating variables while the processor 44 is powered down. The computer-readable storage device or media 46 may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 150 in controlling the vehicle 10. The bus 154 serves to transmit programs, data, status and other information or signals between the various components of the vehicle 102. The bus 154 can be any suitable physical or logical means of connecting computer systems and components. This includes, but is not limited to, direct hard-wired connections, fiber optics, infrared, and wireless bus technologies.

The instructions may include one or more separate programs, each of which comprises an ordered listing of executable instructions for implementing logical functions. The instructions, when executed by the processor 152, are configured to receive and process signals from the CGM 140; perform logic, calculations, methods and/or algorithms for automatically monitoring ground line degradation of the ECU nodes 130-136 in the vehicle 102; and generate remaining useful life (RUL) estimate data to store one or more RUL estimates attributed to one or more of the ECU nodes 130-136 based on the logic, calculations, methods, and/or algorithms. As used herein, the RUL may be a period of time remaining until the degradation (i.e., corrosion) of the ground line of one or more of the ECU nodes 130-136 results in communication loss of greater than a communication loss threshold. In certain embodiments, the RUL may be a period of time until the degradation results in communication loss in which signal supervision is no longer present. Although only one controller 150 is shown in FIG. 1, embodiments of the vehicle 102 can include any number of controllers 150 that communicate over any suitable communication medium or a combination of communication mediums and that cooperate to process the sensor signals, perform logic, calculations, methods, and/or algorithms, and generate the record data. In various embodiments, one or more instructions of the controller 150 are embodied in the bus monitoring system 100 and, when executed by the processor 152, receive data from the CGM 140 and process the data in order to monitor ground line degradation of the ECU nodes 130-136 of the vehicle 102.

As can be appreciated, that the controller 150 may otherwise differ from the embodiment depicted in FIG. 1. For example, the controller 150 may be coupled to or may otherwise utilize one or more remote computer systems and/or other control systems, for example as part of one or more of the above-identified vehicle devices and systems. It will be appreciated that while this exemplary embodiment is described in the context of a fully functioning computer system, those skilled in the art will recognize that the mechanisms of the present disclosure are capable of being distributed as a program product with one or more types of non-transitory computer-readable signal bearing media used to store the program and the instructions thereof and carry out the distribution thereof, such as a non-transitory computer readable medium bearing the program and containing computer instructions stored therein for causing a computer processor (such as the processor 152) to perform and execute the program. Such a program product may take a variety of forms, and the present disclosure applies equally regardless of the particular type of computer-readable signal bearing media used to carry out the distribution. Examples of signal bearing media include recordable media such as floppy disks, hard drives, memory cards and optical disks, and transmission media such as digital and analog communication links. It will be appreciated that cloud-based storage and/or other techniques may also be utilized in certain embodiments. It will similarly be appreciated that the computer system of the controller 150 may also otherwise differ from the embodiment depicted in FIG. 1, for example in that the computer system of the controller 150 may be coupled to or may otherwise utilize one or more remote computer systems and/or other control systems.

Optionally, the vehicle 102 may further include a wireless unit 160 for wireless communication with remote electronic devices, an interface port 170 for coupling with a corresponding data cable 412 of an external electronic device 410, and/or a visual display 180. It should be understood that the communications network may include a plurality of communications networks (including a plurality of CANs), may include more or fewer ECU nodes, may include ECU nodes that are members of one or more wire buses, and may include a wire bus with more or fewer bus wires.

Figure 2:
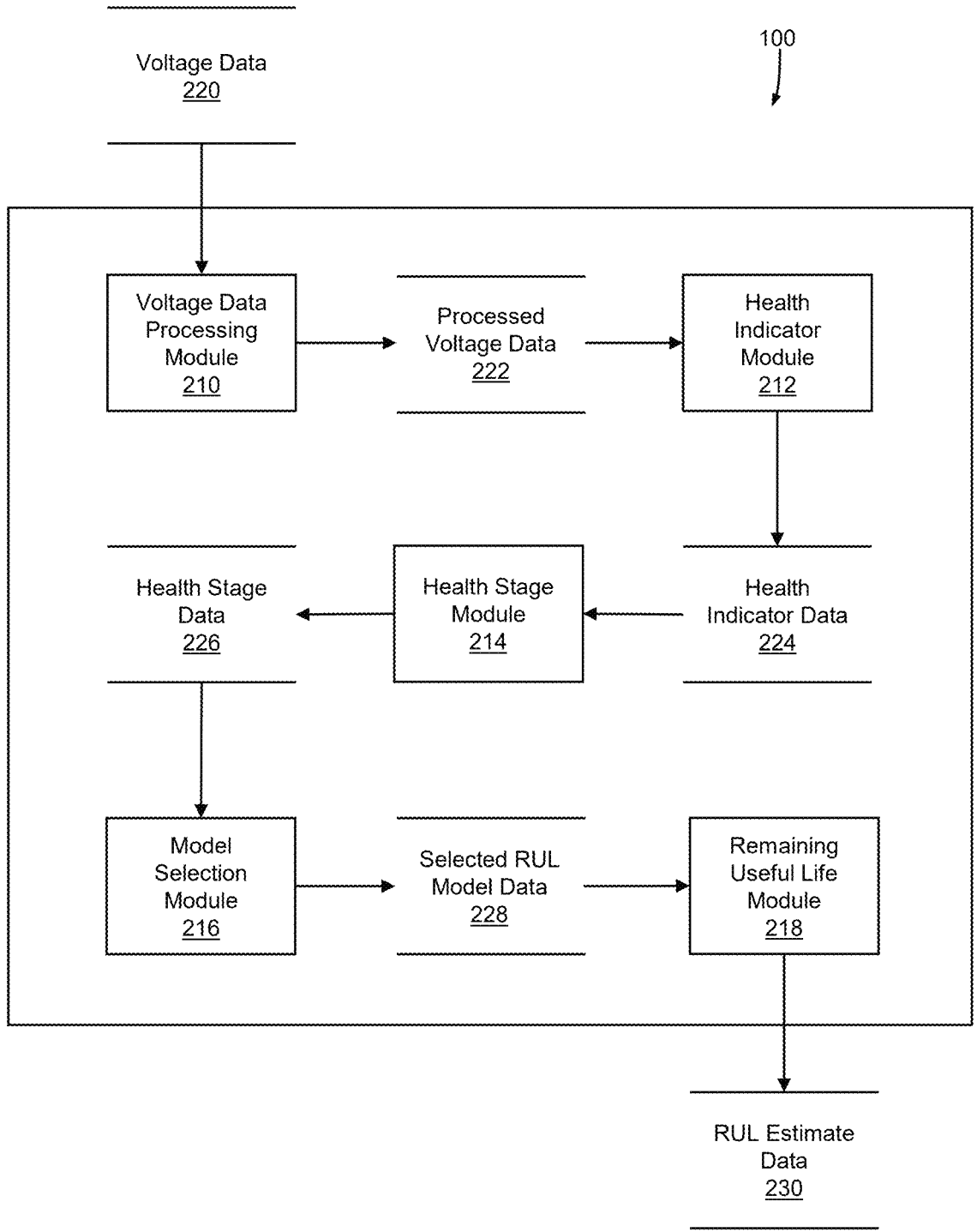
FIG. 2 is a dataflow diagram illustrating elements of the bus monitoring system of the vehicle of FIG. 1, in accordance with various embodiments.

With reference to FIG. 2 and with continued reference to FIG. 1, a dataflow diagram illustrates elements of the bus monitoring system 100 of FIG. 1 in accordance with various embodiments. As can be appreciated, various embodiments of the bus monitoring system 100 according to the present disclosure may include any number of modules embedded within the controller 150 which may be combined and/or further partitioned to similarly implement systems and methods described herein. Furthermore, inputs to the bus monitoring system 100 may be received from the CGM 140, received from other control modules (not shown) associated with the vehicle 102, and/or determined/modeled by other sub-modules (not shown) within the controller 150 of FIG. 1. Furthermore, the inputs might also be subjected to pre-processing, such as sub-sampling, noise-reduction, normalization, feature-extraction, missing data reduction, and the like. In various embodiments, the bus monitoring system 100 includes a voltage data processing module 210, a health indicator module 212, a health stage module 214, a model selection module 216, and a RUL module 218.

In various embodiments, the voltage data processing module 210 receives as input voltage data 220 generated by the CGM 140. The voltage data 220 includes various data indicating measurements of voltage corresponding to messages transmitted on the communication bus 120. In various embodiments, the voltage data 220 may be limited to the recessive state of the CAN.

The voltage data processing module 210 performs various preprocessing, buffering, and/or filtering processes on the voltage data 220. In various embodiments, the processes include buffering the voltage data 220, at least in part, using equation (1), wherein $CANHI_{(t)}$ and $CANLO_{(t)}$ are the measured voltages over time for the recessive state of the CAN High wire 122 and the CAN Low wire 124, respectively, and a threshold, $K_{REC\_TH}$ (e.g., about 100 to 250 mV) used to identify recessive bits.

$$|CANHI_{(t)}| - |CANLO_{(t)}| < K_{REC\_TH}$$

In the above example, the buffered data obtained with equation (1) is used to compute, by the voltage data processing module 210, a common mode statistical distribution of the recessive state ($CM_{REC}$) using equation (2).

$$CM_{REC} = \frac{\left[CANHigh_{Buffer} + CANLow_{Buffer}\right]}{2} \quad (2)$$

The voltage data processing module 210 may further remove outlier data via, for example, adaptive outlier removal techniques. For example, outlier data exceeding two standard deviations may be excluded.

In various embodiments, the health indicator module 212 receives as input processed voltage data 222 generated by the voltage data processing module 210. The processed voltage data 222 includes various data generated by the preprocessing, buffering, and/or filtering of the voltage data 220. In various embodiments, the processed voltage data 222 includes common mode voltage distribution.

The health indicator module 212 performs an analysis of the processed voltage data 222 to generate health indicators (e.g., statistical moments) associated with ground fault of the ECU nodes 130-136. In various embodiments, the health indicators may include an arithmetic mean and/or a kurtosis of the common mode voltage distribution (e.g., $CM_{REC}$). The health indicators may be fused to define fused health indicators.

In various embodiments, the health stage module 214 receives as input health indicator data 224 generated by the health indicator module 212. The health indicator data 224 includes various data including health indicators of ground fault on the communication bus 120. In various embodiments, the health indicator data 224 includes a fusion of the arithmetic mean and the kurtosis of the common mode voltage distribution.

The health stage module 214 analyzes the health indicator data 224 and determines a health stage of the communication bus 120 and/or one or more of the ECU nodes 130-136 based thereon. The health stages may be modeled based on data corresponding to relationships between ground degradation and communication loss between ECU nodes of CANs. In various embodiments, ground line degradation may be determined to cause little to no communication loss for ground offsets of less than 10 ohms, moderate communication loss for ground offsets of between 10 and 35 ohms, and severe communication loss for ground offsets of greater than 35 ohms. In various embodiments, total communication loss may be observed for ground offsets of greater than about 50 ohms. The health stages may be presented as percentages of communication quality or other parameters based on the resistance measurements. For example, in various embodiments, the health stages may associate 100 percent health to about 0 to 8 ohms, 75 percent health to about 8 to 22 ohms, 50 percent health to about 22 to 38 ohms, 25 percent health to about 38 to 48 ohms, and zero percent health to greater than about 48 ohms. When a health stage is determined to be less than a predefined health stage threshold, the health stage module 214 may generate or initiate generation of a notification such that the CAN may be inspected to avoid significant communication loss.

In various embodiments, the model selection module 216 receives as input health stage data 226 generated by the health stage module 214. The health stage data 226 includes various data relating to the health stage of the communication bus 120 and/or one or more of the ECU nodes 130-136. In various embodiments, the health stage data 226 may include health stages presented as percentages of communication quality or other parameters based on the resistance measurements.

The model selection module 216 analyzes the health stage data 226 to select a suitable RUL model (e.g., similarity model) from a plurality of RUL models. In various embodiments, the model selection module 216 may buffer the health stage data 226 to define buffered health stage data prior to use thereof for determining a suitable RUL model. In various embodiments, the RUL models may be based on various information which may include, for example, historical data corresponding to CAN degradation/failure due to ground fault, historical data corresponding to ground line degradation over time/travel distance (i.e., mileage), data corresponding to specifics of the vehicle and/or the CAN (e.g., architecture, materials, message traffic, etc.), data corresponding to specifics of the vehicle use (e.g., geographic location, road/off-road conditions, commercial/personal, etc.), and/or other relevant data. After a RUL model is selected, the model selection module 216 may update degradation levels and confidence intervals associated with the CAN and store data associated with such updates.

In various embodiments, the RUL module 218 receives as input selected RUL model data 228 generated by the model selection module 216. The selected RUL model data 228 includes various data relating to a selected RUL model.

The RUL module 218 uses the selected RUL model data 228 to generate a RUL estimate that is attributed to the communication bus 120 and/or one or more of the ECU nodes 130-136. In various embodiments, the RUL module 218 generates an uncertainty value of the RUL estimate. The RUL module 218 may generate, transmit, and/or store RUL estimate data 230 that includes various data including one or more RUL estimates and uncertainty values associated therewith.

Figure 3:
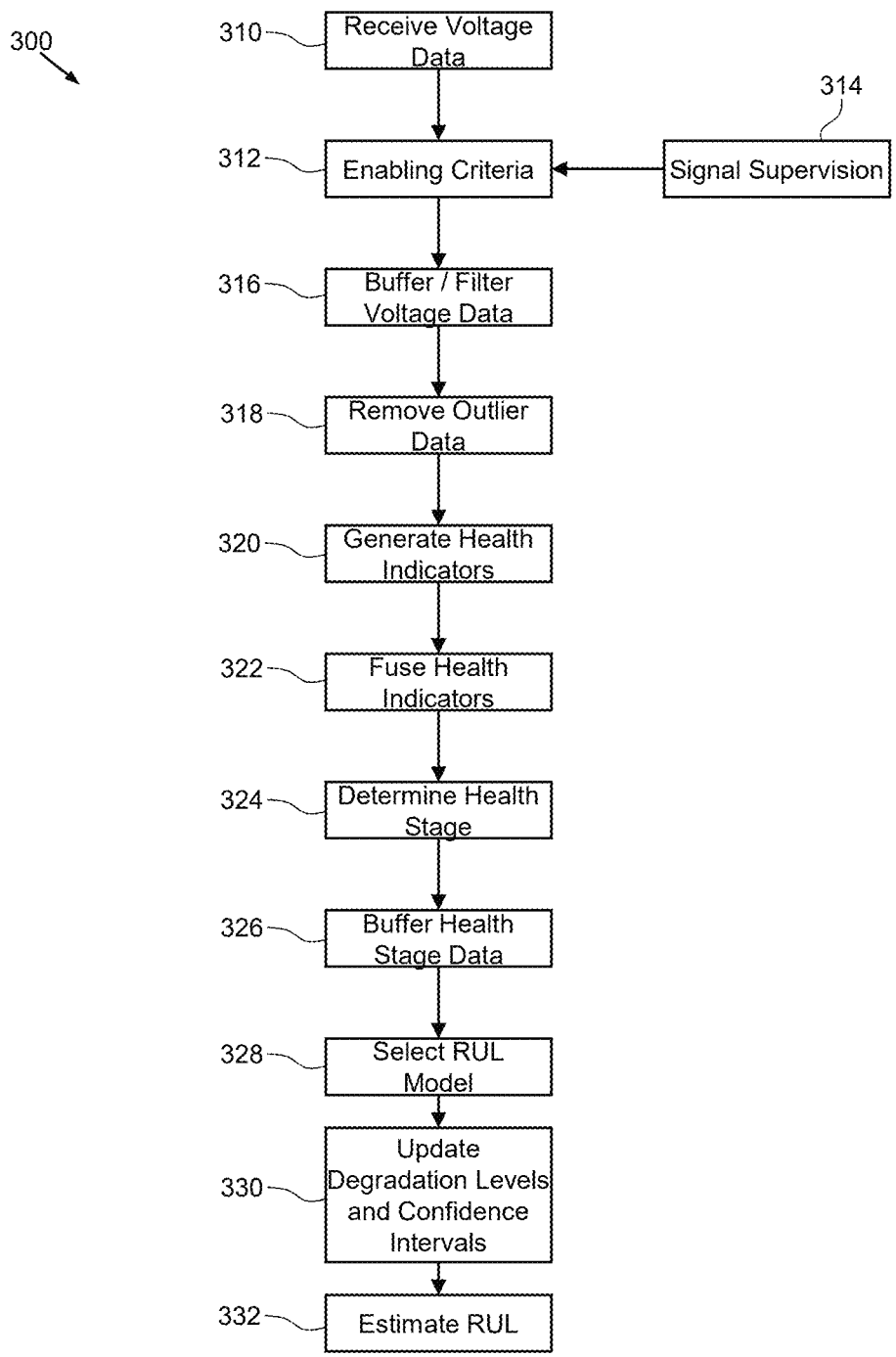
FIG. 3 is flowchart of a process for monitoring ground line degradation as performed by the bus monitoring system of the vehicle of FIGS. 1 and 2, in accordance with various embodiments.

With reference now to FIG. 3 and with continued reference to FIGS. 1-2, a flowchart provides a method 300 for monitoring ground line degradation of electric devices coupled to a communication bus as performed by the bus monitoring system 100, in accordance with exemplary embodiments. As can be appreciated in light of the disclosure, the order of operation within the method 300 is not limited to the sequential execution as illustrated in FIG. 3, but may be performed in one or more varying orders as applicable and in accordance with the present disclosure. In various embodiments, the method 300 can be scheduled to run based on one or more predetermined events, and/or can run continuously during operation of the vehicle 102.

In one example, the method 200 includes receiving the voltage data 220 (step 310) corresponding to messages transmitted on the communication bus 120 of the CAN. The voltage data 220 may be continuously measured and recorded as long as an enabling criteria is met at 312. In some embodiments, the enabling criteria corresponds to communication loss as determined by the presence of a supervised signal at 314. In various embodiments, the CGM 140 continuously measures and records the voltage of the messages as the voltage data 220 and provides the voltage data 220 to the controller 150. The voltage data 220 may be preprocessed, buffered, and/or filtered (step 316). In various embodiments, the common mode voltage distribution may be obtained based on the recessive state of the CAN. Outliers may be removed from the voltage distribution data (step 318).

Health indicators (step 320; e.g., statistical moments) associated with ground fault of the ECU nodes 130-136 may be generated. In various embodiments, the health indicators may include an arithmetic mean and/or a kurtosis of the common mode voltage distribution (e.g., $CM_{REC}$). The health indicators may be fused (step 322) to define fused health indicators.

Health stages of the communication bus 120 and/or the ECU nodes 130-136 may then be determined (step 324) based on the fused health indicators. In various embodiments, if a generated health stage is determined to be less than a predefined health stage threshold, a notification may be generated such that the CAN may be inspected to avoid significant communication loss.

The health stages may be buffered (step 326) to define buffered health stage data and the buffered health stage data may be used to determine a suitable RUL model (e.g., similarity model) from a plurality of RUL models (step 328). Degradation levels and confidence levels may be updated as necessary (step 330). One or more RUL estimates and, optionally, uncertainty values associated therewith may be generated for the communication bus 120 and/or the ECU nodes 130-136.

In this manner, the resistance of the ground lines may be associated with a period of time corresponding to a RUL estimate, that is, a period of time remaining until the degradation (i.e., corrosion) of the ground line results in communication loss of greater than a communication loss threshold. For example, the RUL estimate may be a period of time until the health stage reaches zero percent health (e.g., a resistance of greater than about 48 ohms). Depending on the architecture of the CANs of the vehicle 102, the controller 150 may generate the RUL estimate for one or more ECU nodes and/or one or more CANs.

Once the RUL estimate has been generated, the RUL estimate and, optionally, the uncertainty value associated therewith may be displayed on the visual display 180, stored for subsequent retrieval via the interface port 170 by the electronic device 410, or transmitted via the wireless unit 160 to a remote database 400 or a computing device. In some examples, an RUL estimate that is less than a RUL estimate threshold may result in the generation of a diagnostic trouble code that may be subsequently read via an onboard diagnostic (OBD) II interface or the like. Generation of the diagnostic trouble code may initiate a notification, such as illuminating a dashboard light. In such examples, an appropriate party, such as a vehicle owner, technician, etc. may perform corrective actions (e.g., repair/replace a corroded ground line) within a convenience timeframe (e.g., within a range of degradation that is sufficient to proceed with corrective actions but prior to significant communication loss). If the ground fault is detected at early stages thereof, the corrective action may prevent or reduce the likelihood of a significant communication loss and/or avoid failure of critical systems of the vehicle 102.

In various embodiments, the health stage and/or RUL estimate may be uploaded to a remote computer system, such as the remote database 400, for analysis. In various embodiments, one or more steps of the method 300 may be modified based on the analysis, such as modifications to the plurality of RUL models, to parameters used for identification of the suitable RUL model, to health stage classifications, to health indicators, and/or to buffering/filtering algorithms.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for monitoring ground line degradation of an electric device coupled to a non-isolated multi-drop communication bus, the method comprising:
- receiving, by a processor, voltage data over a period of time including measurements of voltages of a plurality of messages transmitted by the electric device over the communication bus;
- buffering, by the processor, the voltage data in a recessive state to define buffered voltage data;
- computing, by the processor, a common mode statistical distribution from the buffered voltage data;
- generating, by the processor, one or more health indicators from the voltage data associated with ground line degradation of the electric device, the one or more health indicators including one or more statistical moments calculated based on the voltage data, wherein generating the one or more health indicators includes determining an arithmetic mean and/or kurtosis of the common mode statistical distribution;
- determining, by the processor, a health stage of the electric device based on the one or more health indicators, the health stage including a classification based on a relationship between ground line degradation and communication loss for the electric device; and
- generating or initiating, by the processor, a notification if the health stage is less than a minimum health stage threshold, wherein the notification is displayed on a visual display in communication with the processor.

2. The method of claim 1, further comprising, by the processor:
- buffering the health stage to select a first remaining useful life (RUL) model from a plurality of RUL models; and
- generating a RUL estimate of the electric device based on the health stage, the RUL estimate including a period of time remaining until the ground line degradation results in communication loss of greater than a communication loss threshold.

3. The method of claim 2, further comprising determining an uncertainty value associated with the RUL estimate.

4. The method of claim 1, wherein the communication bus is a component of a controller area network (CAN), and the electric device is one of a plurality of electronic control unit (ECU) nodes coupled to the communication bus.

5. The method of claim 1, further comprising measuring the voltages with a second processor executing a central gateway module (CGM).

6. The method of claim 1, further comprising fusing, by the processor, the one or more health indicators prior to estimating the health stage therewith.

7. The method of claim 1, wherein generating the one or more health indicators includes fusing an arithmetic mean and kurtosis of the common mode statistical distribution.

8. The method of claim 1, wherein the notification is displayed as a percentage of communication quality on the communication bus.

9. The method of claim 1, wherein the notification is generated prior to significant communication loss associated with a resistance of the communication bus of 48 ohms.

10. A system of a vehicle for monitoring ground line degradation of an electronic control unit (ECU) node coupled to a communication bus of a controller area network (CAN), the system comprising:
- a computer system configured to, by a processor:
  - receive voltage data over a period of time including measurements of voltages of a plurality of messages transmitted by the ECU node over the communication bus;
  - buffer the voltage data in a recessive state to define buffered voltage data;
  - compute a common mode statistical distribution from the buffered voltage data;
  - generate one or more health indicators from the voltage data associated with ground line degradation of the ECU node, the one or more health indicators including one or more statistical moments calculated based on the voltage data, wherein generating the one or more health indicators includes determining an arithmetic mean and/or kurtosis of the common mode statistical distribution;
  - determine a health stage of the ECU node based on the one or more health indicators, the health stage including a classification based on a relationship between ground line degradation and communication loss for the ECU node; and
  - generate or initiate a notification if the health stage is less than a minimum health stage threshold, wherein the notification is displayed on a visual display in communication with the processor.

11. The system of claim 10, wherein the computer system is configured to, by the processor, generate a remaining useful life (RUL) estimate of the ECU node based on the health stage, the RUL estimate including a period of time remaining until the ground line degradation results in communication loss of greater than a communication loss threshold.

12. The system of claim 11, wherein the computer system is configured to, by the processor, buffer the health stage to select a first RUL model from a plurality of RUL models prior to generating the RUL estimate of the ECU node with the first RUL model.

13. The system of claim 11, wherein the computer system is configured to, by the processor, determine an uncertainty value associated with the RUL estimate.

14. The system of claim 10, wherein the computer system is configured to, by the processor, measure the voltages.

15. The system of claim 10, wherein the computer system is configured to, by the processor, remove outliers from the common mode statistical distribution.

16. The system of claim 10, wherein the computer system is configured to, by the processor, fuse the one or more health indicators prior to estimating the health stage therewith.

17. The system of claim 10, wherein the computer system is configured to, by the processor, generate the one or more health indicators by, at least in part, fusing an arithmetic mean and kurtosis of the common mode statistical distribution.

18. The system of claim 10, wherein the notification is displayed as a percentage of communication quality on the communication bus.

19. A vehicle, comprising:
- a controller area network (CAN) having a communication bus;
- an electronic control unit (ECU) node coupled to the communication bus;
- a visual display;
- a computer system onboard the vehicle in communication with the ECU node and the visual display and configured to, by a processor:
  - receive voltage data over a period of time including measurements of voltages of a plurality of messages transmitted by the ECU node over the communication bus;
  - buffer the voltage data in a recessive state to define buffered voltage data;
  - compute a common mode statistical distribution from the buffered voltage data;
  - generate one or more health indicators from the voltage data associated with ground line degradation of the ECU node, the one or more health indicators including one or more statistical moments calculated based on the voltage data, wherein generating the one or more health indicators includes determining an arithmetic mean and/or kurtosis of the common mode statistical distribution; and
  - determine a health stage of the ECU node based on the one or more health indicators, the health stage including a classification based on a relationship between ground line degradation and communication loss for the ECU node; and
  - generate or initiate a notification if the health stage is less than a minimum health stage threshold, wherein the notification is displayed on the visual display.

20. The vehicle of claim 19, wherein the computer system is configured to, by the processor:
- buffer the health stage to select a first remaining useful life (RUL) model from a plurality of RUL models; and
- generate a RUL estimate of the ECU node based on the health stage, the RUL estimate including a period of time remaining until the ground line degradation results in communication loss of greater than a communication loss threshold.

* * * * *